(12) United States Patent
Liang et al.

(10) Patent No.: US 10,157,900 B2
(45) Date of Patent: Dec. 18, 2018

(54) SEMICONDUCTOR STRUCTURE AND MANUFACTURING METHOD THEREOF

(71) Applicant: Taiwan Semiconductor Manufacturing Company, Ltd., Hsin-Chu (TW)

(72) Inventors: Shih-Wei Liang, Dajia Township (TW); Hsin-Yu Pan, Taipei (TW); Kai-Chiang Wu, Hsin-Chu (TW); Ching-Feng Yang, Taipei (TW); Ming-Kai Liu, Hsin-Chu (TW); Chia-Chun Miao, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/380,821

(22) Filed: Dec. 15, 2016

(65) Prior Publication Data

US 2017/0098640 A1    Apr. 6, 2017

Related U.S. Application Data

(62) Division of application No. 14/061,615, filed on Oct. 23, 2013, now Pat. No. 9,543,373.

(51) Int. Cl.
*H01L 23/495* (2006.01)
*H01L 25/00* (2006.01)
(Continued)

(52) U.S. Cl.
CPC ............ *H01L 25/50* (2013.01); *H01L 21/486* (2013.01); *H01L 23/3114* (2013.01); *H01L 23/3677* (2013.01); *H01L 23/488* (2013.01); *H01L 23/49894* (2013.01); *H01L 23/5384* (2013.01); *H01L 23/5389* (2013.01); *H01L 24/17* (2013.01); *H01L 24/19* (2013.01); *H01L 24/20* (2013.01); *H01L 24/24* (2013.01); *H01L 25/065* (2013.01); *H01L 25/0657* (2013.01);
(Continued)

(58) Field of Classification Search
CPC ... H01L 25/50; H01L 21/486; H01L 25/0657; H01L 23/5389; H01L 24/17; H01L 24/19; H01L 24/24; H01L 24/20; H01L 23/3672; H01L 23/3677; H01L 23/49568
See application file for complete search history.

(56) References Cited

U.S. PATENT DOCUMENTS

2007/0069363 A1    3/2007  Kawabata et al.
2008/0136004 A1    6/2008  Yang et al.
(Continued)

*Primary Examiner* — Bitew Dinke
(74) *Attorney, Agent, or Firm* — Slater Matsil, LLP

(57) ABSTRACT

A semiconductor structure includes a three dimensional stack including a first semiconductor die and a second semiconductor die. The second semiconductor die is connected with the first semiconductor die with a bump between the first semiconductor die and the second semiconductor die. The semiconductor structure includes a molding compound between the first semiconductor die and the second semiconductor die. A first portion of a metal structure over a surface of the three dimensional stack and contacting a backside of the second semiconductor die and a second portion of the metal structure over the surface of the three dimensional stack and configured for electrically connecting the three dimensional stack with an external electronic device.

20 Claims, 15 Drawing Sheets

(51) Int. Cl.
| | |
|---|---|
| *H01L 49/02* | (2006.01) |
| *H01L 23/31* | (2006.01) |
| *H01L 23/367* | (2006.01) |
| *H01L 25/065* | (2006.01) |
| *H01L 23/488* | (2006.01) |
| *H01L 21/48* | (2006.01) |
| *H01L 23/538* | (2006.01) |
| *H05K 1/18* | (2006.01) |
| *H05K 3/46* | (2006.01) |
| *H01L 23/522* | (2006.01) |
| *H01L 23/00* | (2006.01) |
| *H01L 23/498* | (2006.01) |

(52) U.S. Cl.
CPC ............ *H01L 28/10* (2013.01); *H05K 1/186* (2013.01); *H05K 3/4682* (2013.01); *H01L 23/49816* (2013.01); *H01L 23/522* (2013.01); *H01L 24/16* (2013.01); *H01L 2224/0233* (2013.01); *H01L 2224/02373* (2013.01); *H01L 2224/02381* (2013.01); *H01L 2224/05008* (2013.01); *H01L 2224/05009* (2013.01); *H01L 2224/05022* (2013.01); *H01L 2224/05572* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/12105* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13184* (2013.01); *H01L 2224/16145* (2013.01); *H01L 2224/16227* (2013.01); *H01L 2224/1703* (2013.01); *H01L 2224/17181* (2013.01); *H01L 2224/17519* (2013.01); *H01L 2224/211* (2013.01); *H01L 2224/2101* (2013.01); *H01L 2224/24105* (2013.01); *H01L 2224/24146* (2013.01); *H01L 2224/24225* (2013.01); *H01L 2224/73209* (2013.01); *H01L 2224/80815* (2013.01); *H01L 2224/81191* (2013.01); *H01L 2224/81815* (2013.01); *H01L 2224/9202* (2013.01); *H01L 2224/92124* (2013.01); *H01L 2225/06513* (2013.01); *H01L 2225/06517* (2013.01); *H01L 2225/06524* (2013.01); *H01L 2225/06527* (2013.01); *H01L 2225/06548* (2013.01); *H01L 2225/06568* (2013.01); *H01L 2225/06589* (2013.01); *H01L 2924/12042* (2013.01); *H01L 2924/13091* (2013.01); *H01L 2924/181* (2013.01); *H01L 2924/18161* (2013.01); *H01L 2924/18162* (2013.01); *H05K 2203/0733* (2013.01)

(56) References Cited

U.S. PATENT DOCUMENTS

| | | | |
|---|---|---|---|
| 2008/0211086 | A1 | 9/2008 | Morita |
| 2008/0308950 | A1* | 12/2008 | Yoo .................. H01L 25/16 257/778 |
| 2009/0001542 | A1* | 1/2009 | Kim .................. H01L 23/3128 257/686 |
| 2009/0045523 | A1* | 2/2009 | Fan .................. H01L 25/105 257/777 |
| 2009/0146297 | A1 | 6/2009 | Badakere et al. |
| 2009/0236686 | A1 | 9/2009 | Shim et al. |
| 2009/0309212 | A1* | 12/2009 | Shim .................. H01L 21/568 257/700 |
| 2009/0315170 | A1 | 12/2009 | Shim et al. |
| 2010/0144101 | A1 | 6/2010 | Chow et al. |
| 2010/0230806 | A1 | 9/2010 | Huang et al. |
| 2011/0068459 | A1 | 3/2011 | Pagaila et al. |
| 2011/0186977 | A1 | 8/2011 | Chi et al. |
| 2011/0215354 | A1 | 9/2011 | Wang |
| 2011/0227223 | A1* | 9/2011 | Wu .................. H01L 24/82 257/738 |
| 2011/0278717 | A1 | 11/2011 | Pagaila et al. |
| 2011/0285007 | A1* | 11/2011 | Chi .................. H01L 24/96 257/686 |
| 2011/0285012 | A1 | 11/2011 | Yu et al. |
| 2012/0012990 | A1* | 1/2012 | Pagaila .................. H01L 23/5389 257/659 |
| 2012/0038034 | A1 | 2/2012 | Shin et al. |
| 2012/0049364 | A1* | 3/2012 | Sutardja .................. H01L 24/24 257/738 |
| 2012/0146216 | A1 | 6/2012 | Kang et al. |
| 2012/0187572 | A1* | 7/2012 | Lin .................. H01L 21/565 257/774 |
| 2012/0217628 | A1 | 8/2012 | Chou et al. |
| 2012/0217629 | A1 | 8/2012 | Cho et al. |
| 2012/0280860 | A1 | 11/2012 | Kamgaing et al. |
| 2012/0292745 | A1 | 11/2012 | Park et al. |
| 2013/0056871 | A1* | 3/2013 | Yu .................. H01L 23/3114 257/738 |
| 2013/0075924 | A1 | 3/2013 | Lin et al. |
| 2013/0105991 | A1* | 5/2013 | Gan .................. H01L 25/105 257/777 |
| 2013/0168850 | A1 | 7/2013 | Samoilov et al. |
| 2013/0307140 | A1* | 11/2013 | Huang .................. H01L 23/49827 257/737 |
| 2014/0077364 | A1 | 3/2014 | Marimuthu et al. |
| 2014/0091471 | A1* | 4/2014 | Chen .................. H01L 24/19 257/770 |
| 2014/0091473 | A1 | 4/2014 | Len et al. |
| 2014/0131858 | A1* | 5/2014 | Pan .................. H01L 24/13 257/737 |
| 2014/0185264 | A1 | 7/2014 | Chen et al. |
| 2014/0217604 | A1* | 8/2014 | Chou .................. H01L 24/11 257/774 |
| 2014/0262475 | A1* | 9/2014 | Liu .................. H01L 25/50 174/377 |
| 2014/0312491 | A1* | 10/2014 | Jin .................. H01L 23/481 257/737 |
| 2017/0033080 | A1* | 2/2017 | Chen .................. H01L 25/0657 |

* cited by examiner

SEMICONDUCTOR STRUCTURE AND MANUFACTURING METHOD THEREOF

CROSS REFERENCE TO RELATED APPLICATIONS

This application is a divisional of U.S. patent application Ser. No. 14/061,615, filed on Oct. 23, 2013, now U.S. Pat. No. 9,543,373 and entitled "Semiconductor Structure and Manufacturing Method Thereof", which application is herein incorporated herein in its entirety by reference.

BACKGROUND

Chip scale packages (CSP) are widely adopted for semiconductor chip assemblies in the industry because the component has a smaller size. A popular methodology of manufacturing a CSP component is a technology called surface mounting technology (SMT). The surface mounting technology is a method in which the semiconductor chip is mounted or placed directly on the surface of a printed circuit board (PCB). A semiconductor component made with SMT usually has either smaller bonding wires or no bonding wires at all.

Semiconductor chip enclosed in the chip scale component includes thousands of transistors and other miniaturized devices. The circuitry density keeps increasing as technology capability migrates from micron to nano scale. With a down-trending size, electronic products become more and more popular because its functionality and weight can fit in different occasions and applications.

However, heat generation in the packaged semiconductor component is discovered to be a drawback while people are celebrating the achievement of multi-chip stack package. Gaps in the three dimensional structure of a multi-chip stack are filled with materials like molding compound or other CTE match layer that traps heat inside the package. Undesired overheating is observed to be one of the major root causes of component malfunction. Some solutions such as adding fan or other external cooling to the component are implemented but still can not resolve the issue. Hence, a methodology to improve heat dissipation is still to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
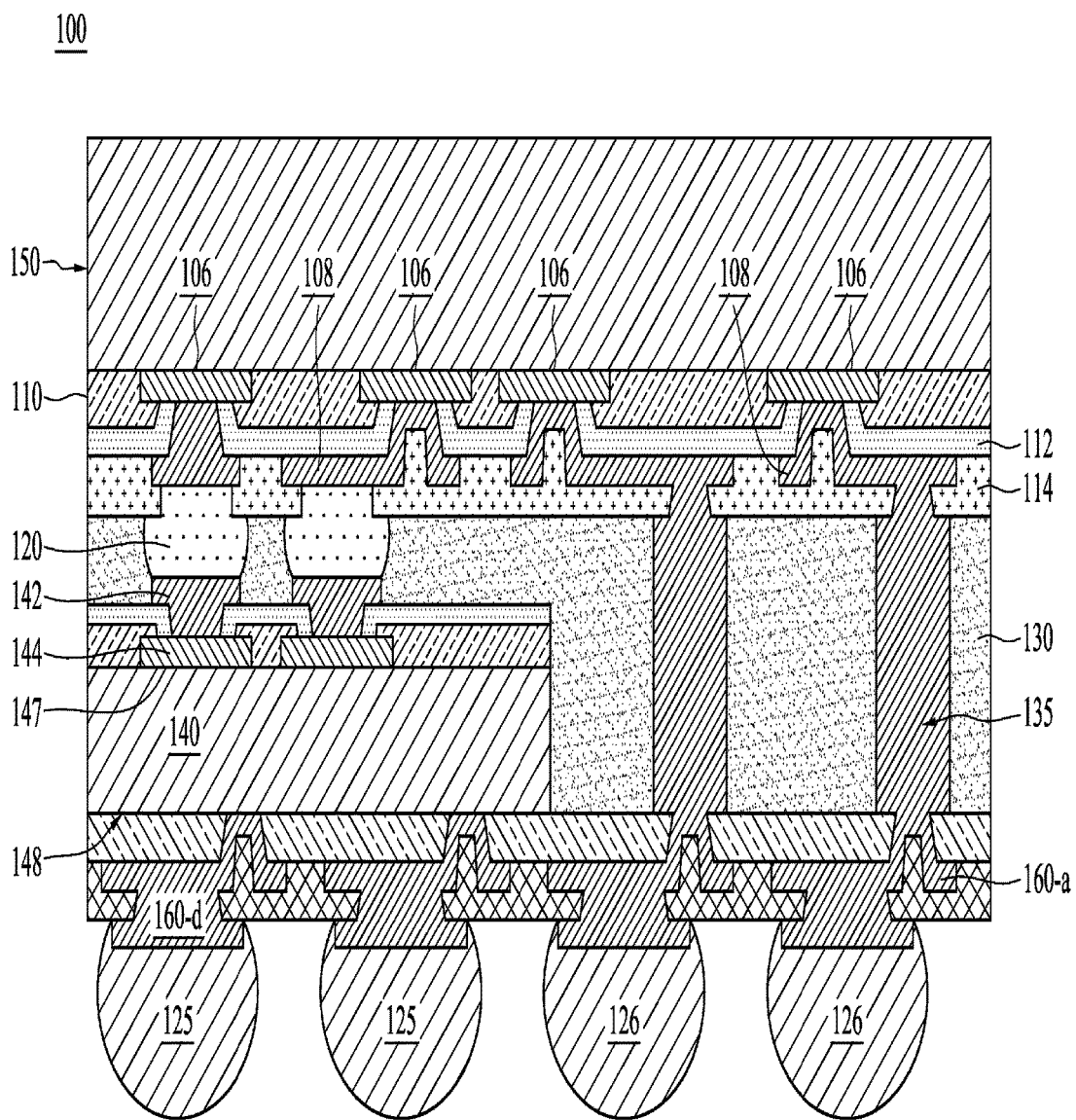
FIG. 1 is a cross sectional view of a semiconductor structure with dummy metal structure for dissipating heat in accordance with some embodiments of the present disclosure.

The manufacturing and use of the embodiments are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Further, it is understood that several processing steps and/or features of a device may be only briefly described. Also, additional processing steps and/or features can be added and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

In the present disclosure, a heat dissipation structure is disposed on a semiconductor device to facilitate transferring thermal energy from the semiconductor device to ambient air. In some embodiments, the semiconductor device is in a chip-on-chip (COC) semiconductor structure, which is an integrated three dimensional stack of multiple semiconductor chips or dies. Heat generated inside the semiconductor device is dispelled by the heat dissipation structure disposed on a passive surface of the semiconductor device. The heat dissipation structure is fabricated to utilize some dummy conductive components without affecting device performance.

As used herein, "vapor deposition" refers to operations of depositing materials on a substrate using a vapor phase of a material to be deposited or a precursor of the material. Vapor deposition operations include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), sputtering, thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like.

As uses herein, a "passive surface" refers to a surface of a semiconductor chip or die that is not configured to have any electrical terminal or contact for its normal operation. For example, for a semiconductor die, the passive surface is referred to a backside of the semiconductor die. Instead, an "active surface" is a surface including electrical terminal or contact for electrical connecting with an external circuit or device. In some embodiments, the active surface has metal pads exposing through a protective dielectric layer on top of the die. The metal pads are extension of internal circuitry of the die and designed to be coupled with a conductive material such as metal wire, conductive trace during post end packaging operation.

FIG. 1 is a semiconductor structure 100. In some embodiments, the semiconductor structure 100 is three dimensional. The semiconductor structure 100 includes at least two independent semiconductor devices that are assembled altogether to form a stack. The independent semiconductor devices are connected by a bump 120. One of the independent semiconductor devices has a substrate 150 with a circuitry disposed thereon. The circuitry includes components like metal pads 106, conductive trace 108 formed on a surface of the substrate 150.

In some embodiments, the substrate 150 is a semiconductor chip or die that has a substrate and some embedded devices such as MOSFET. The substrate refers to a bulk semiconductor substrate on which various layers and device structure are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additional integrated circuits.

A dielectric layer 110 disposed on the substrate 150 surrounds metal pad 106. The metal pad 106 provides a connection between internal conductive traces in the substrate and the conductive trace 108. In some embodiments, metal pad 106 is also a portion of the top metal layer of internal conductive traces in the substrate. The dimension of metal pad 106 is determined during top metal etch and an additional etch operation is introduced to expose the metal pad 106 by removing a portion of the dielectric layer 110. Metal pad 106 is made with electrical conductive material such as Au, Ag, Cu, Al, or alloy thereof.

Conductive trace 108 electrically connecting the substrate 105 with another device. In some embodiments, the conductive trace 108 is a redistribution layer (RDL) for a fan-in or fan-out configuration to redirect electrical current. In some embodiments, the conductive trace 108 is a post passivation inductor (PPI). In a two mask (2M) technology, a portion of the PPI is also designed to receive the bump 120 as shown in FIG. 1. In some other embodiments, the conductive trace 108 is fabricated with a four mask (4M) technology and therefore some extra metal structures such as under bump metal (UBM) is further added at one end of the conductive trace 108 for receiving the bump 120. Conductive trace 108 is metallic material such as gold, silver, copper, and alloy thereof. Dielectric materials like a rubber or a polymer material such as epoxy, polyimide, polybenzoxazole (PBO), and the like are disposed over the substrate 105 in order to provide electrical isolation or protection from environment moisture. For some embodiments as in FIG. 1, the dielectric materials includes a first PBO 112 between the passivation 110 and the conductive trace 108; and a second PBO 114 disposed on the conductive trace 108.

Another independent semiconductor device is a semiconductor die 140 which is connected with another end of the bump 120. In some embodiments, the semiconductor die 140 is surface mounted to the substrate 150 and bonded with the substrate 150 through the bump 120. A conductive pad 142 on an active surface 147 of the semiconductor die 140 provides a site to receive the bump 120 so as to build communication path between the semiconductor die 140 and the substrate 150. The semiconductor die 140 has several sub-components such as MOSFET, backend interconnection and dielectric layers. In some embodiments, the semiconductor die 140 includes transistors, resistors, and/or capacitors, which may be interconnected through an interconnect layer to additional integrated circuits.

In some embodiments, the conductive pad 142 is connected with an interconnection such as conductive plugs of the semiconductor die 140. In some embodiments, the conductive pad 142 is a copper pillar extending from a contact pad 144. In some embodiments, the conductive pad 142 is a under bump metal (UBM). In some embodiments, there is an extra conductive interconnect between the contact pad 144 and the conductive pad 142.

In some embodiments, lead-free solder compositions is used to form bump 120. The lead-free solder includes tin, copper and silver (typically 95.5% by weight tin, 4% by weight silver and 0.5% by weight copper). Bismuth may also be used together with tin, antimony and silver in a range of approximately 1.0% to 4.5% by weight. Solder material 36 can be metal or electrically conductive material, e.g., Sn, lead (Pb), Au, Ag, Cu, zinc (Zn), bismuthinite (Bi), and alloys thereof, with an optional flux material.

A molding compound 130 is filled in a gap between the substrate 150 and the semiconductor die 140. Molding compound 130 includes various materials, for example, one or more of epoxy resins, PBO, phenolic hardeners, silicas, catalysts, pigments, mold release agents, and the like. Material for forming a molding compound has a high thermal conductivity, a low moisture absorption rate, a high flexural strength at board-mounting temperatures, or a combination of these.

A metal structure is on a surface of the molding compound 130 and located proximal to the semiconductor die 140. The metal structure has an active metal structure 160-*a* connected to one end of a conducive plug 135 in the molding compound 130. The conducive plug 135 is connected to a conductive trace 108 on the substrate 150 at the other end. An electrical current is able to travel between the active metal structure 160-*a* and the substrate 150, and therefore an external device other than the three dimensional semiconductor structure 100 is electrically coupled with the substrate 150 through the active metal structure 160-*a* and the conductive plug 135. In some embodiments, the external device is an electronic device. As used herein, a component is "active" means that the component is on an electric current path and able to provide electric communication when the semiconductor structure 100 is in operation.

Comparing to the active metal structure 160-*a*, a dummy portion 160-*d* of the metal structure (or called dummy metal structure hereinafter) is not electrically connected with any active component in the structure 100. The dummy metal structure 160-*d* is only disposed on a passive surface 148, which is also a backside of the semiconductor die 140 and opposite to the active surface of the semiconductor die 140. When the three dimensional semiconductor structure 100 is in operation, heat generated in semiconductor die 140 is dissipated from the passive surface 148 by the dummy metal structure 160-*d*. For some embodiments as in FIG. 1, the dummy metal structure 160-*d* has a similar shape as the active metal structure 160-*a*.

Both metal structures, 160-*a* and 160-*d*, are in a same level of the three dimensional semiconductor structure 100. In some embodiments, the active metal structure 160-*a* and dummy structure 160-*d* act as a redistribution layer (RDL). However, the dummy structure 160-*d* is not electrically connected with any circuitry inside or outside the three dimensional semiconductor structure 100. Each of the active or dummy structures is further connected with a bump. For example, the active metal structure 160-*a* is connected with a bump 126 and the dummy metal structure 160-*d* is connected with a bump 125. A bump connected with an active metal structure 160-*a* is also named as an active bump, and a bump connected with a dummy metal structure 160-*d* is also named as a dummy bump. Bumps connected with metal structures 160-*a* and 160-*d* are terminals of the three dimensional semiconductor structure 100 that are designed to be in contact with an external electronic device, such as another semiconductor die or a printed circuit board (PCB). However, a dummy bump like 126 is only designed to be in contact with some electrical isolated conductive features on the external device. No electrical current travels through the dummy bump 125 when the three dimensional semiconductor structure 100 is in operation.

When the three dimensional semiconductor structure 100 is in operation, heat is generated inside the structure 100. The semiconductor die 140, which includes high density of devices, is one of the heat sources. The heat generated from the semiconductor die 140 needs to be dissipated in order to avoid malfunction or breakdown. In the present disclosure, heat generated in the semiconductor die 140 is dissipated to the dummy metal structure 160-*d* from the passive surface 148. Because the passive surface 148 is directly contacting with the dummy metal structure 160-*d*, temperature gradient between the semiconductor die 140 and the dummy metal structure 160-*d* drives heat into the dummy metal structure 160-*d* through the passive surface 148.

Further, dummy metal structure 160-*d* transfers received heats into dummy bump 125. Because dummy bump 125 is fabricated with metallic material and therefore heats on the dummy structure 160-*d* is dissipated by the dummy bump 125 effectively. Thus, the dummy structure 160-*d* and the dummy bump 125 together forms a heat dissipation channel for the semiconductor die 140. One of the advantages to use a dummy bump for heat dissipation is that the dummy bump has a three dimensional surface, such that heats can be efficiently transferred into ambient surrounding the three dimensional surface by the dummy bump.

Figure 2:
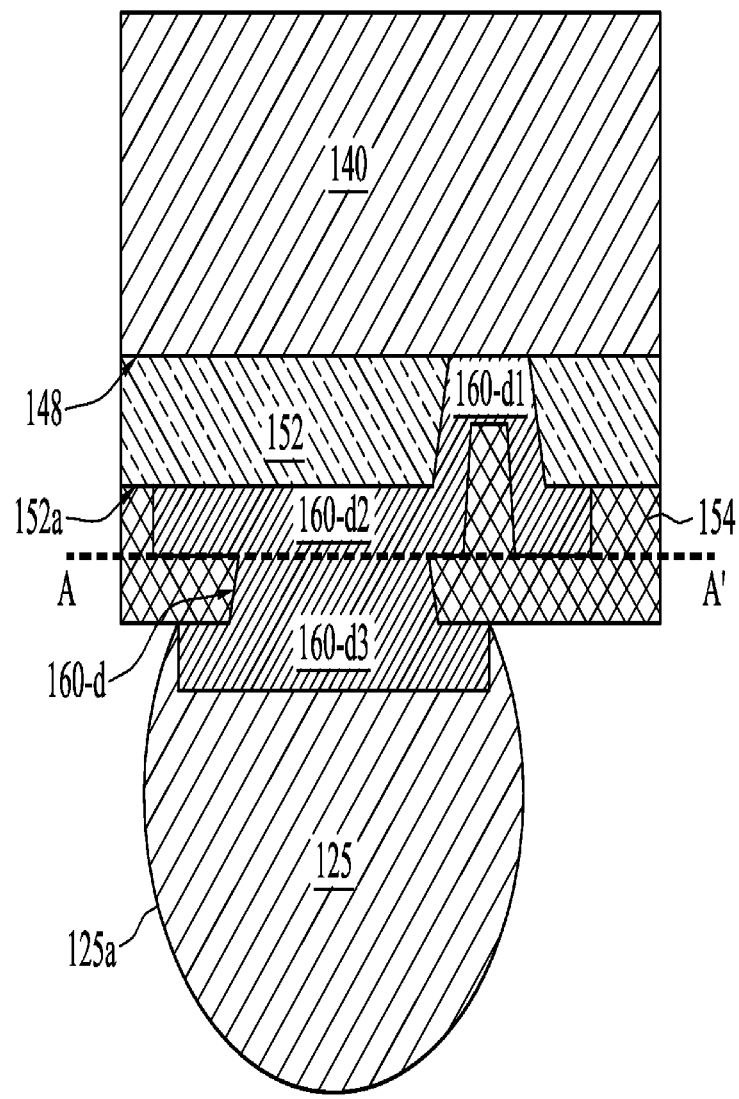
FIG. 2 is an enlarged view of the dummy metal structure and dummy bump in FIG. 1 including in accordance with some embodiments of the present disclosure.

FIG. 2 is an enlarged view of the dummy metal structure 160-*d* and dummy bump 125 as in FIG. 1. The dummy metal structure 160-*d* has a portion 160-*d*1 being in contact with the passive surface 148 of the semiconductor die 140. In FIG. 2, the portion 160-*d*1 is a recessed portion and surrounded by a dielectric layer 152. The dummy structure 160-*d* has a portion 160-*d*2 extending from the recessed portion 160-*d*1 to be over a top surface 152*a* of the dielectric 152. Another portion 160-*d*3 is connected with portion 160-*d*2 and has a flat surface for receiving a dummy bump 125. In some embodiments, the portion 160-*d*3 is an UBM with a recessed top surface for receiving dummy bump 125. In some embodiments, the UBM includes multiple metallic layers, and is formed with a conductive material such as gold, silver, copper, nickel, tungsten, aluminum, and/or alloys thereof. Heat generated in the semiconductor die 140 is firstly transferred to the recessed portion 160-*d*1 and then being conducted into portions 160-*d*2 and 160-*d*3. After that, portion 160-*d*3 transfers the heat into dummy bump 125. The heat transferred into dummy bump 125 is further dissipated into ambient through a three dimensional surface 125*a*. Dummy metal structure 160-*d* includes be Al, Cu, Sn, Ni, Au, Ag, or other suitable conductive material.

A dielectric layer 154 is disposed over the dielectric 152 to isolate a portion of the dummy metal structure 160-*d* from electrical shortage or moisture. The dielectric layer 154 also covers the recessed portion 160-*d*1 and surrounds portion 160-*d*2. The dielectric layer 154 includes rubber or polymer material such as epoxy, polyimide, polybenzoxazole (PBO), and the like.

Figure 3:
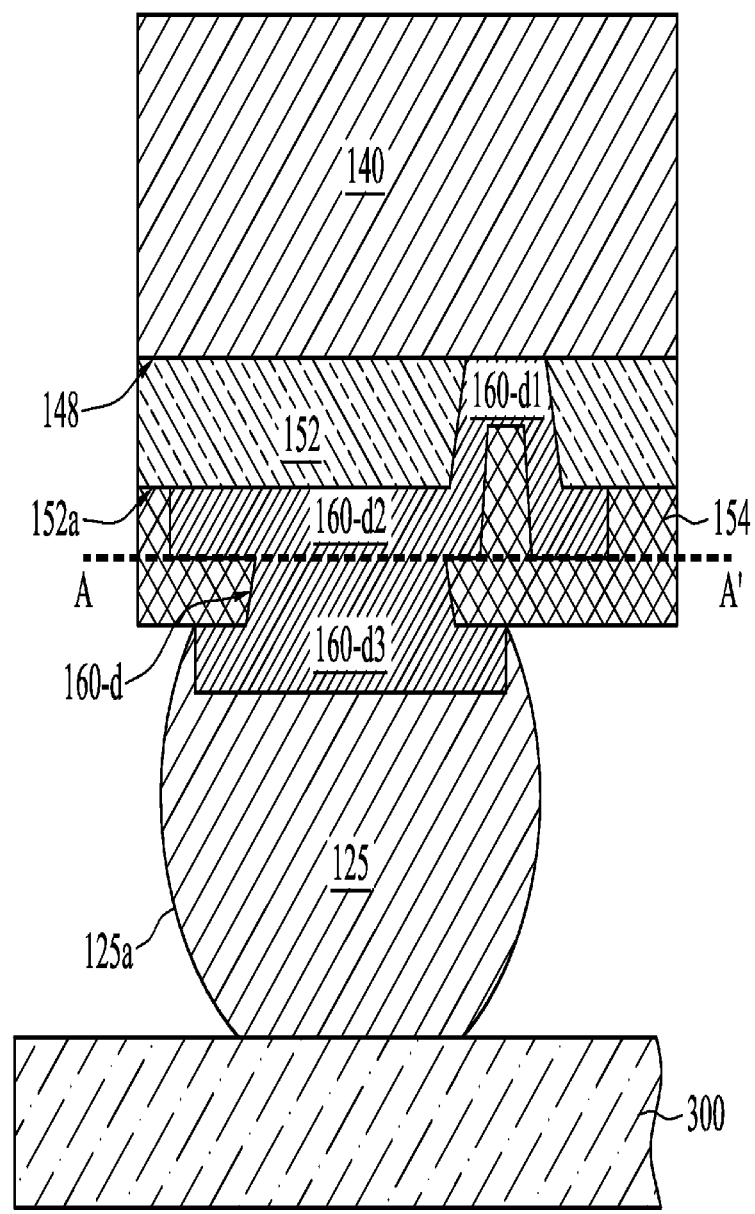
FIG. 3 is a cross sectional view of a dummy metal structure and a dummy bump in contact with a heat sink in accordance with some embodiments of the present disclosure.
Figure 4:
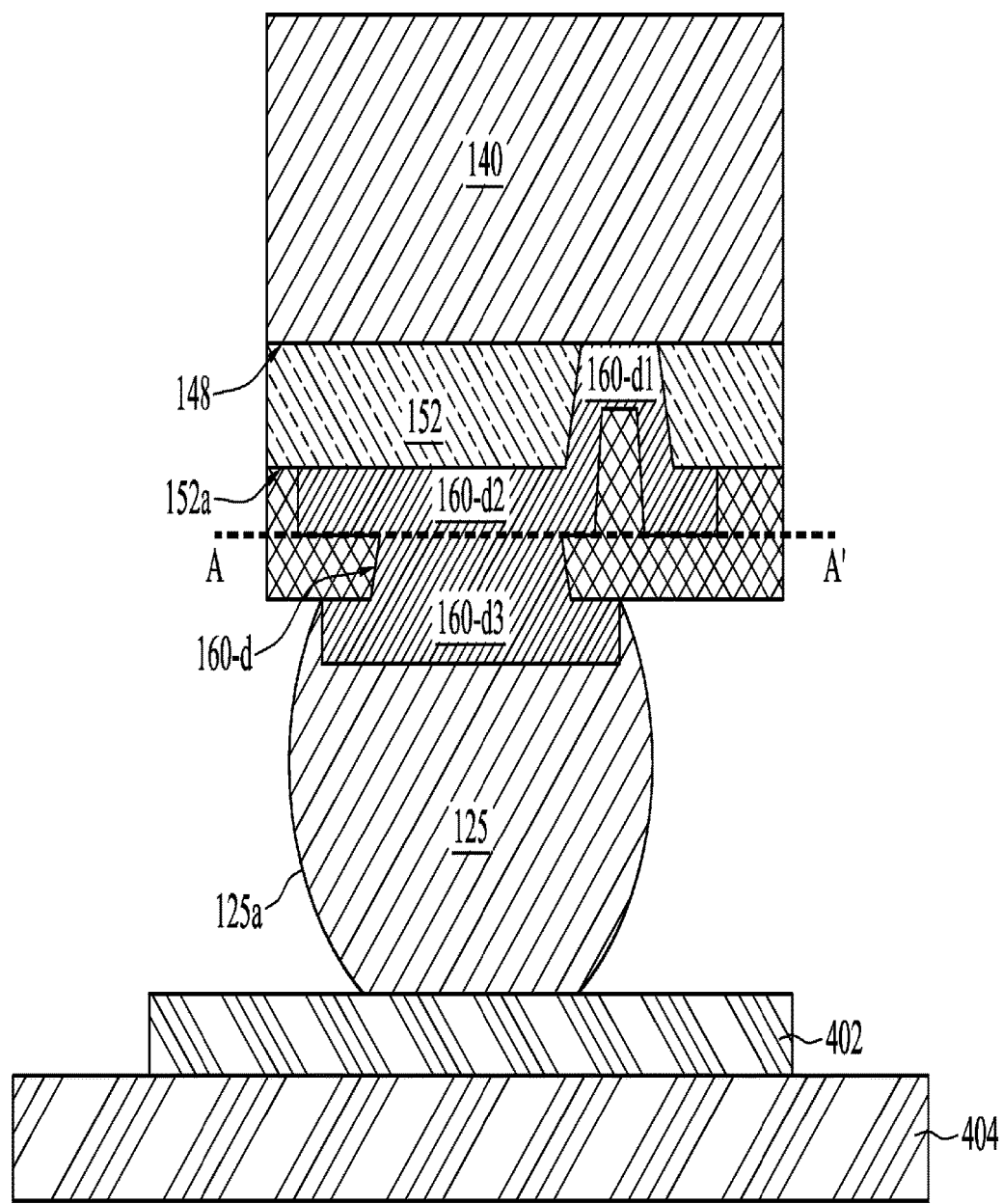
FIG. 4 is a cross sectional view of a dummy metal structure and a dummy bump in contact with a dummy heat conductive trace on a PCB in accordance with some embodiments of the present disclosure.

The dummy bump 125 can be connected with a heat sink 300 at one end as shown in FIG. 3. The heat sink 300 is designed to keep a temperature constantly lower than the dummy bump 125. Temperature gradient between the dummy bump 125 and heat sink 300 drives heats in dummy bump 125 toward the heat sink 300. In FIG. 4, a heat conductive trace 402 on an external device such as PCB 404 acts as a heat sink to carry heats away from dummy bump 125. In some embodiments, the trace 402 is a dummy electrical trace of the PCB 404. The trace 402 is composed with various high thermal conductivity materials such as metal, grapheme, carbon nano-tube, diamond, etc.

Figure 5:
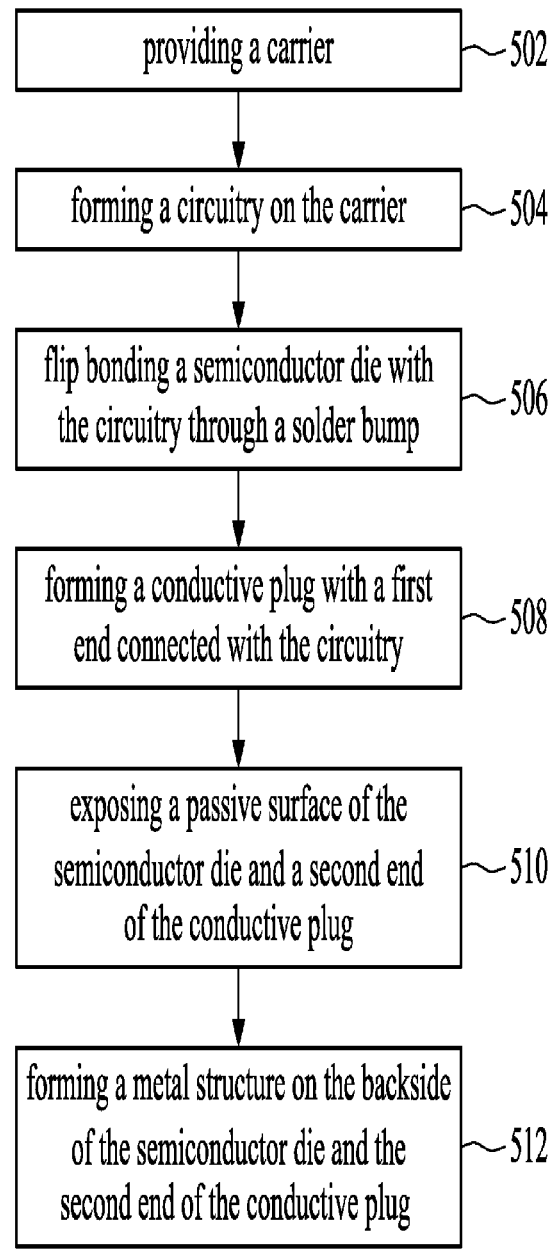
FIG. 5 is a flow chart diagram of a method for manufacturing a semiconductor structure in accordance with some embodiments of the present disclosure.

FIG. 5 is a flowchart of a method 500 for fabricating a semiconductor structure according to various aspects of the present disclosure. Referring also to FIGS. 6A to 6K, illustrated are different views of a semiconductor structure at various stages of fabrication according to the method 500 of FIG. 5. In some embodiments, the semiconductor structure is a three dimensional stack. It should be noted that part of the semiconductor structure may be fabricated with a wafer level package process flow. Accordingly, it is understood that additional processes may be provided before, during, and after the method 500 of FIG. 5. It is understood that FIGS. 6A to 6K have been simplified for the clarity to better understand the inventive concepts of the present disclosure. The semiconductor structure may be fabricated to become a fan-in or fan-out structure. Some metallization process may be implemented to form interconnections provided as communication signal traces of the semiconductor dies.

The method 500 includes operation 502 in which a substrate is provided. The method 500 continues with operation 504 in which a circuitry is formed on a top surface of the substrate. The method 500 continues with operation 506 in which a semiconductor die is flipped and bonded with the circuitry through a bump. The method 500 continues with operation 508 in which a conductive plug is formed and a first end of the conductive plug is connected with the circuitry. The method 500 continues with operation 510 in which a passive surface of the semiconductor die and a second end of the conductive plug are exposed. The method 500 continues with operation 512 in which a metal structure is formed on the backside of the semiconductor die and the second end of the conductive plug.

Elements with same labeling numbers as those in FIG. 1 to FIG. 4 are previously discussed with reference thereto and are not repeated here for simplicity.

Figure 6A:
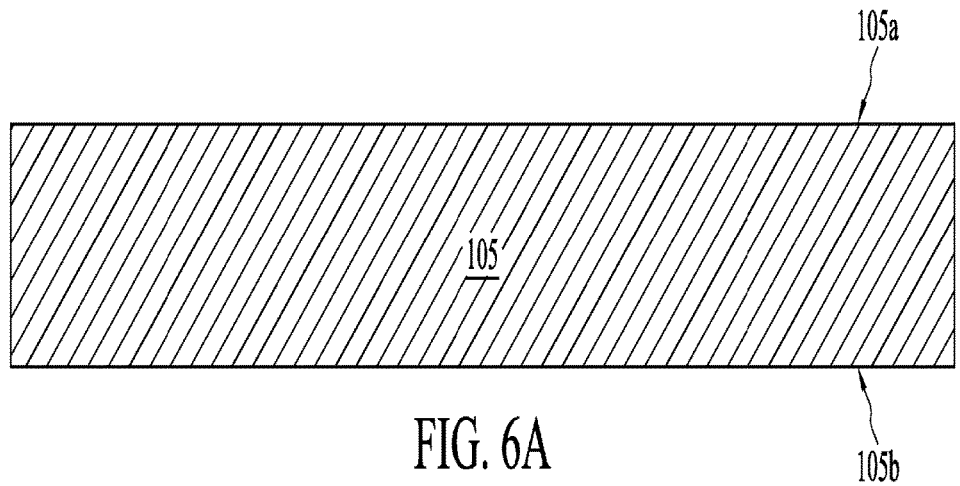
FIG. 6A to FIG. 6K are cross sectional views of a semiconductor structure at different operation stage in accordance with some embodiments of the present disclosure.
Figure 6B:
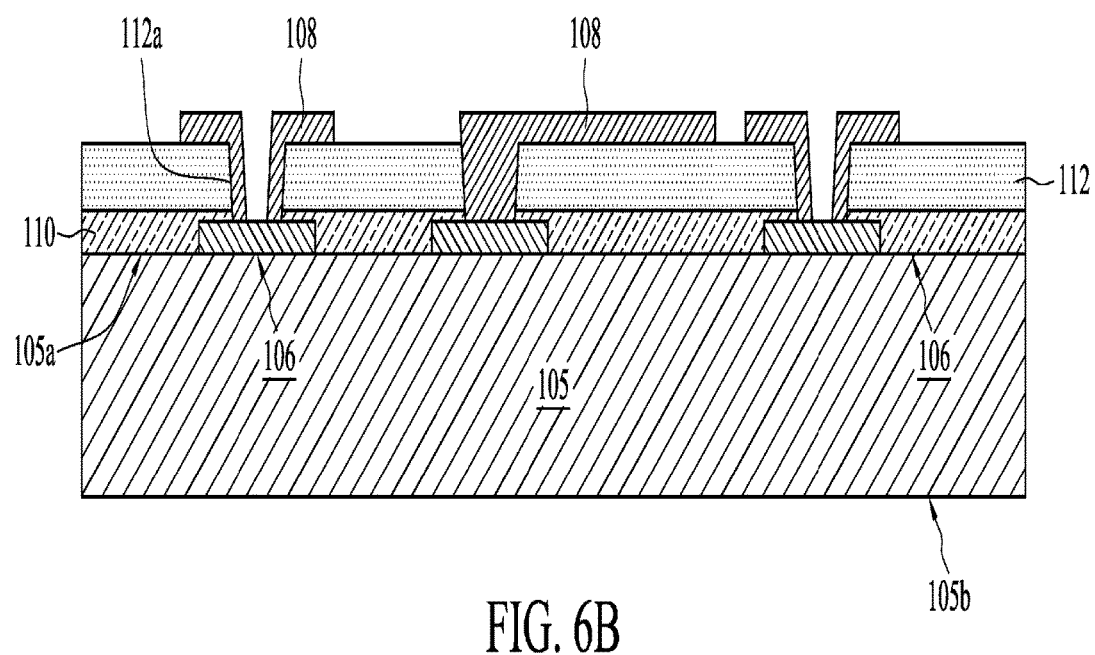

In FIG. 6A, a substrate 105 is provided. The substrate 105 has a top surface 105*a* and a bottom surface 105*b*. A circuitry is formed on the top surface 105*a* as in FIG. 6B. The circuitry includes some metal pads 106 located directly on the top surface 105*a*. A metal conductive trace, such as PPI 108 is connected with a metal pad 106 directly. Some dielectric materials are inserted between different conductive material layers. A dielectric layer 110, which is also a passivation of the substrate 105 is disposed to surround the metal pad 106. In some embodiments, the metal pad 106 is formed during a top metal etch operation. Metal pad 106 is formed along with top metal patterning. The dielectric layer 110 is disposed thereafter to cover the metal pad 106 and an extra etch operation is introduced to remove a portion of the dielectric 110 and expose the metal pad 106.

Another dielectric 112 is disposed on the dielectric 110 and metal pad 106. In some embodiments, the dielectric 112 is a PBO layer and the PBO is spin coated on the dielectric 110. Opening like 112a is formed in a photo lithography operation to expose the metal pad 106. In some embodiments, the PBO is replaced with other dielectric material such as silicon oxide, silicon nitride, or oxynitride, and an etch operation is adopted to form the opening 112a. Conductive film is further disposed on the PBO and filled in the opening 112a. In some embodiments, the conductive film is metal and formed with a vapor deposition, sputter, or other methods. The conductive film is then etched to form conductive trace 108 on the dielectric 112.

Figure 6C:
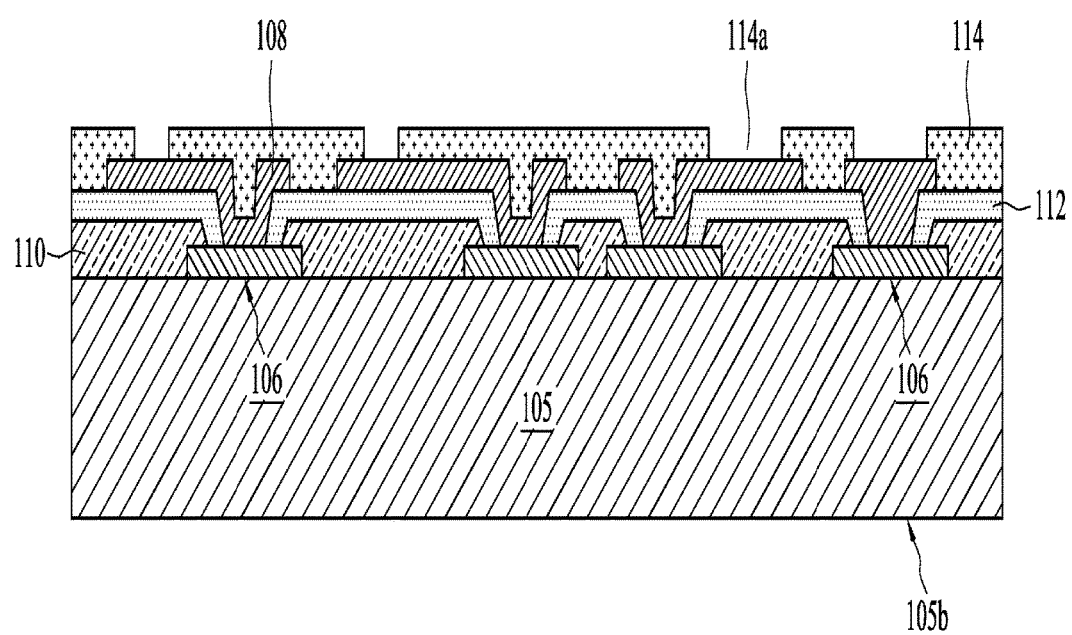

In FIG. 6C, a dielectric 114 is further disposed on the dielectric 112 and conductive trace 108. In some embodiments, both dielectric 112 and dielectric 114 are formed with PBO. Dielectric 112 is called PBO1, and dielectric 114 is called PBO2. Some openings 114a are formed by a photo lithography process to expose a portion of conductive trace 108.

Figure 6D:
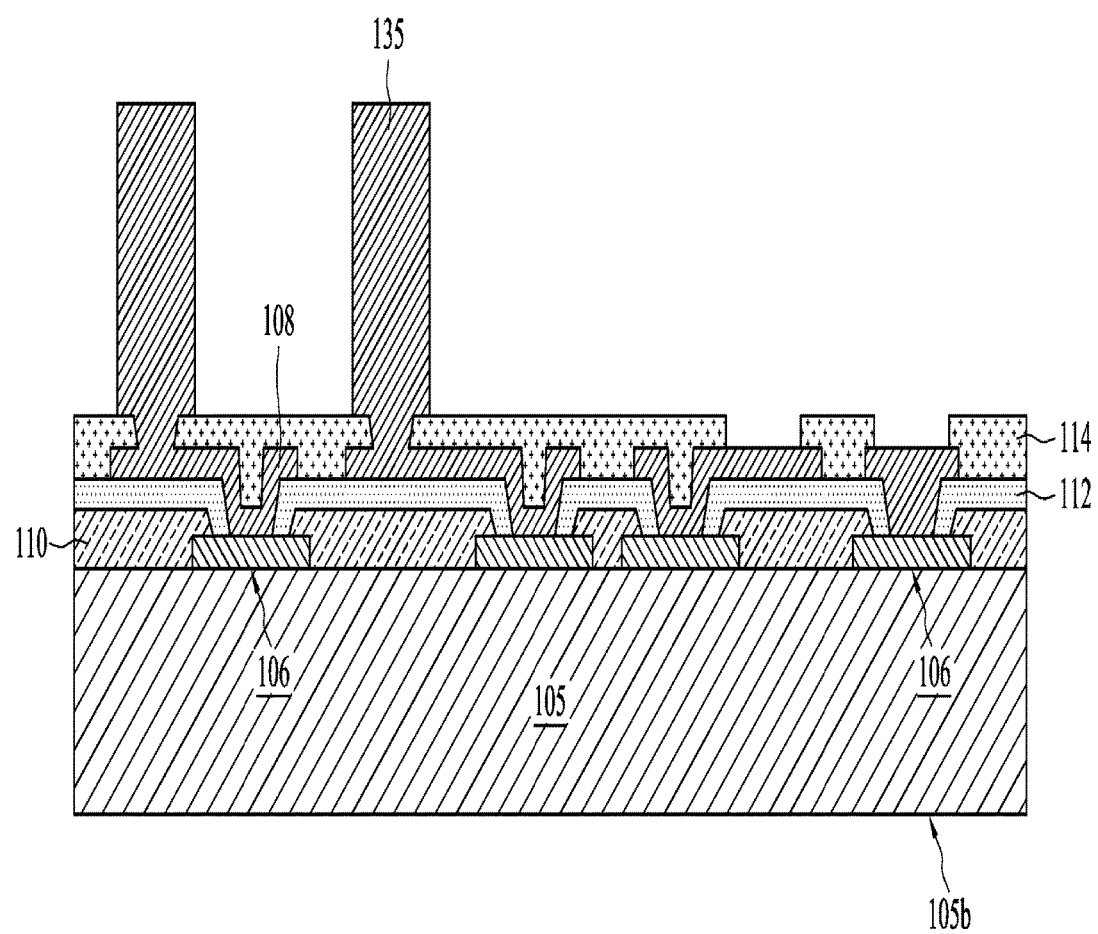

Conductive plugs 135 are formed on some exposed conductive trace 108 as in FIG. 6D. In some embodiments, a patterned photo resist is disposed on the dielectric 114 with some openings. In some embodiments, a plating operation includes forming a physical vapor deposition (PVD) seed layer in the openings and electroplating a metallic film on the seed layer. In some embodiments, a plating operation is a sputtering process. After filling the opening in the patterned photo resist, the patterned photo resist is removed and leaves conductive plug 135 standing over the substrate 105 as in FIG. 6D.

Figure 6E:
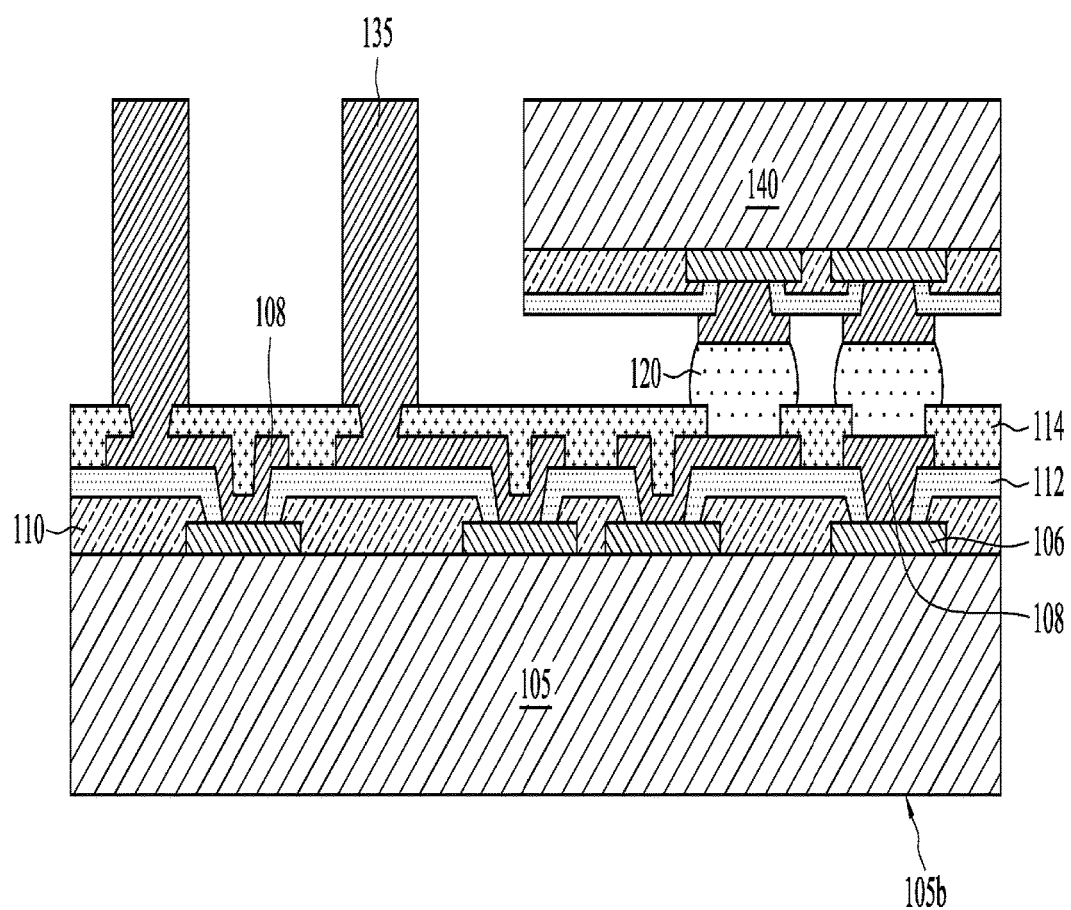

In FIG. 6E, a semiconductor die 140 is flipped and bonded on some conductive traces 108 with bumps 120. In some embodiments, bumps 120 are disposed and reflowed on the semiconductor die 140 prior to bonding the semiconductor die 140 on the conductive traces 108. In some embodiments, bumps 120 is formed on corresponding conductive traces 108 and then bonded the semiconductor die 140 on the bump 120.

Figure 6F:
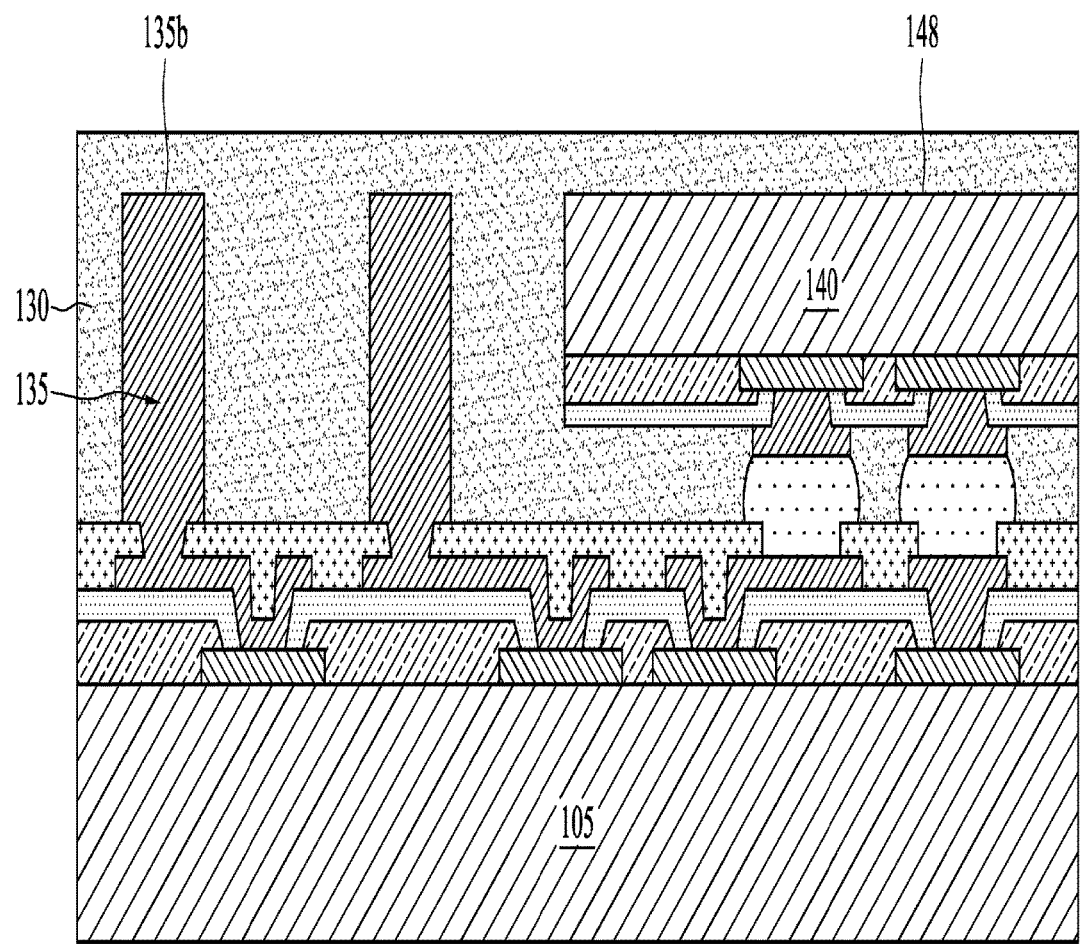
Figure 6G:
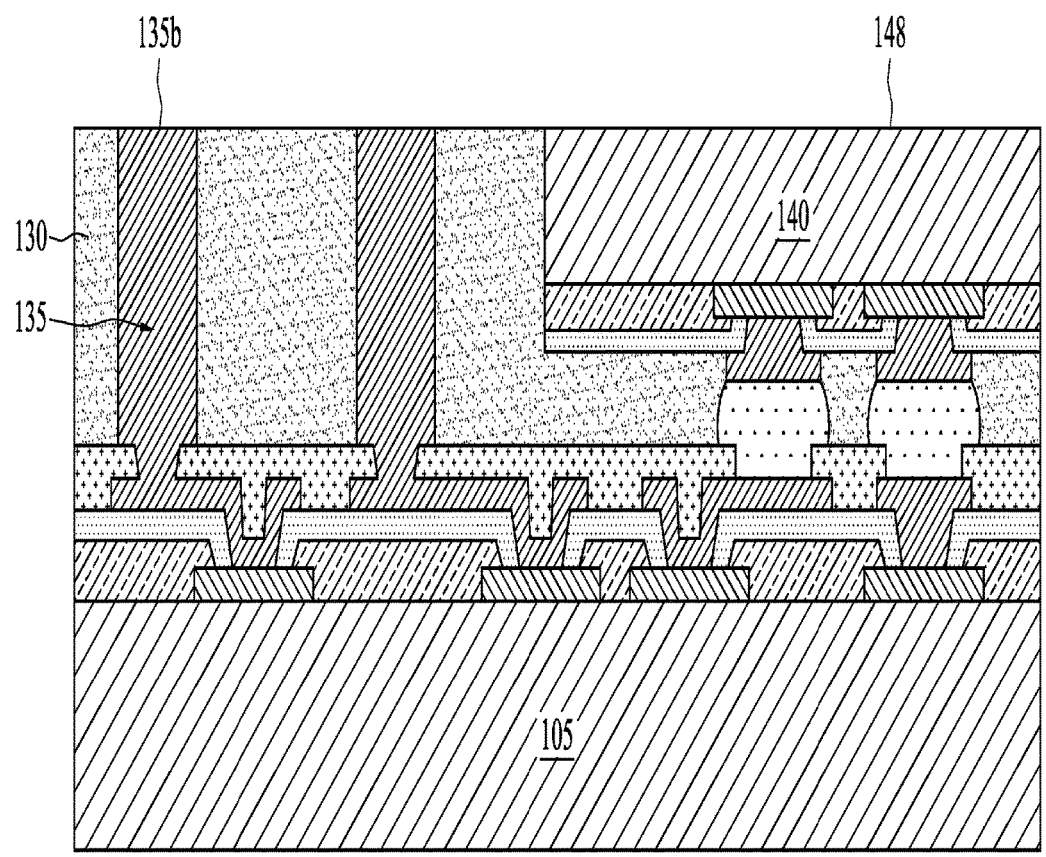

In FIG. 6F, molding compound 130 is used to filled in a gap between semiconductor die 140 and substrate 150. The molding compound 130 also surrounds conductive plugs 135 and semiconductor die 140. In some embodiments as in FIG. 6F, molding compound 130 also covers conductive plugs 135 and semiconductor die 140. An additional operation is needed to remove a portion of molding compound 130 in order to expose a passive surface of the semiconductor die and one end of the conductive plug 135. As in FIG. 6G, one end 135b of the conductive plug 135 and a passive surface 148 of the semiconductor die 140 are exposed. In some embodiments, the molding compound 130 is cured to increase the hardness and then grounded to expose the passive surface 148 and end 135b of the conductive plug 135.

Figure 6H:
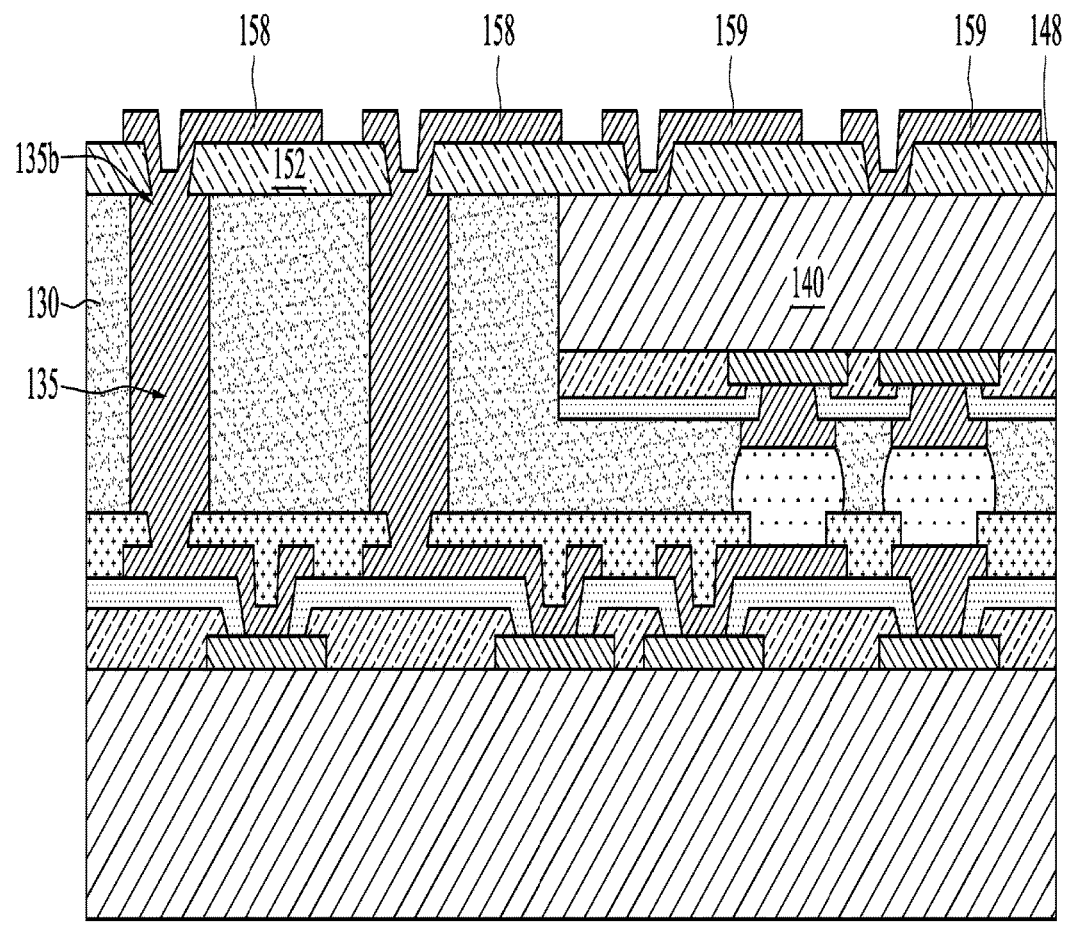

After exposing the passive surface 148 and conductive plug 135, a dielectric layer 152 is disposed on the molding compound 130 and passive surface 148 as in FIG. 6H. In some embodiments, the dielectric layer 152 if formed by spin coating with PBO or other polymeric materials. In some embodiments, the dielectric layer 152 is formed with vapor deposition. Several openings are formed in the dielectric layer 152. Some of the openings are designed to expose end 135b of the conductive plug 135, and some of the openings are designed to expose a portion of the passive surface 148.

Metal structures like 158 and 159 are filled into the openings. Active metal structure 158 is disposed on a corresponding conductive plug 135 in order to provide communication between an external electronic device and the substrate 105. Dummy metal structure 159 is formed to be in contact with the passive surface 148 for heat dissipation. In some embodiments, both active and dummy structures are formed during same operations. The operations include forming a conductive film on the dielectric 152 with electroplating and then pattering the conductive film to form the layout of metal structures 158 and 159.

Figure 6I:
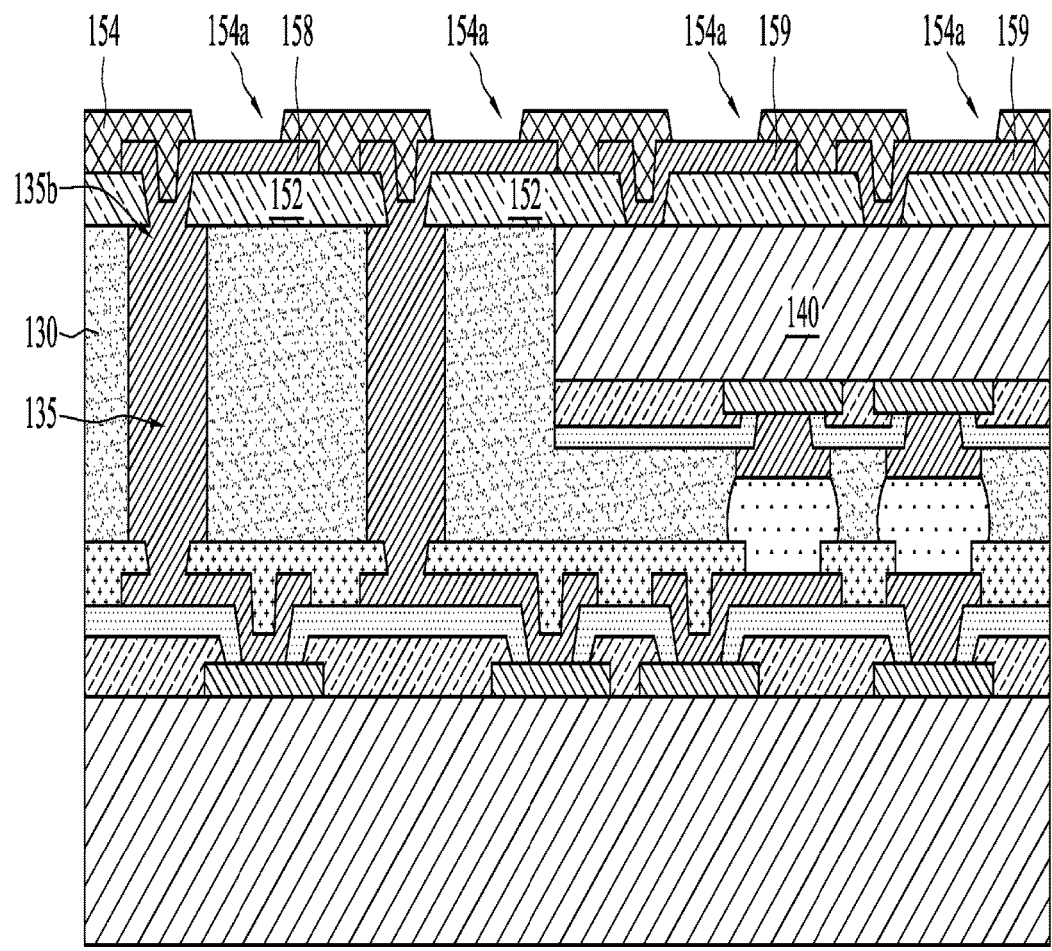

In FIG. 6I, another dielectric 154 is disposed on dielectric 152 and metal structures 158 and 159 with coating or vapor deposition. Several opening 154a are formed to expose a portion of metal structures 158 and 159. In some embodiments, the dielectric 154 is formed with PBO or other polymeric materials. In some embodiments, the dielectric 154 is formed with silicon oxide, silicon nitride, or other suitable dielectric materials.

Figure 6J:
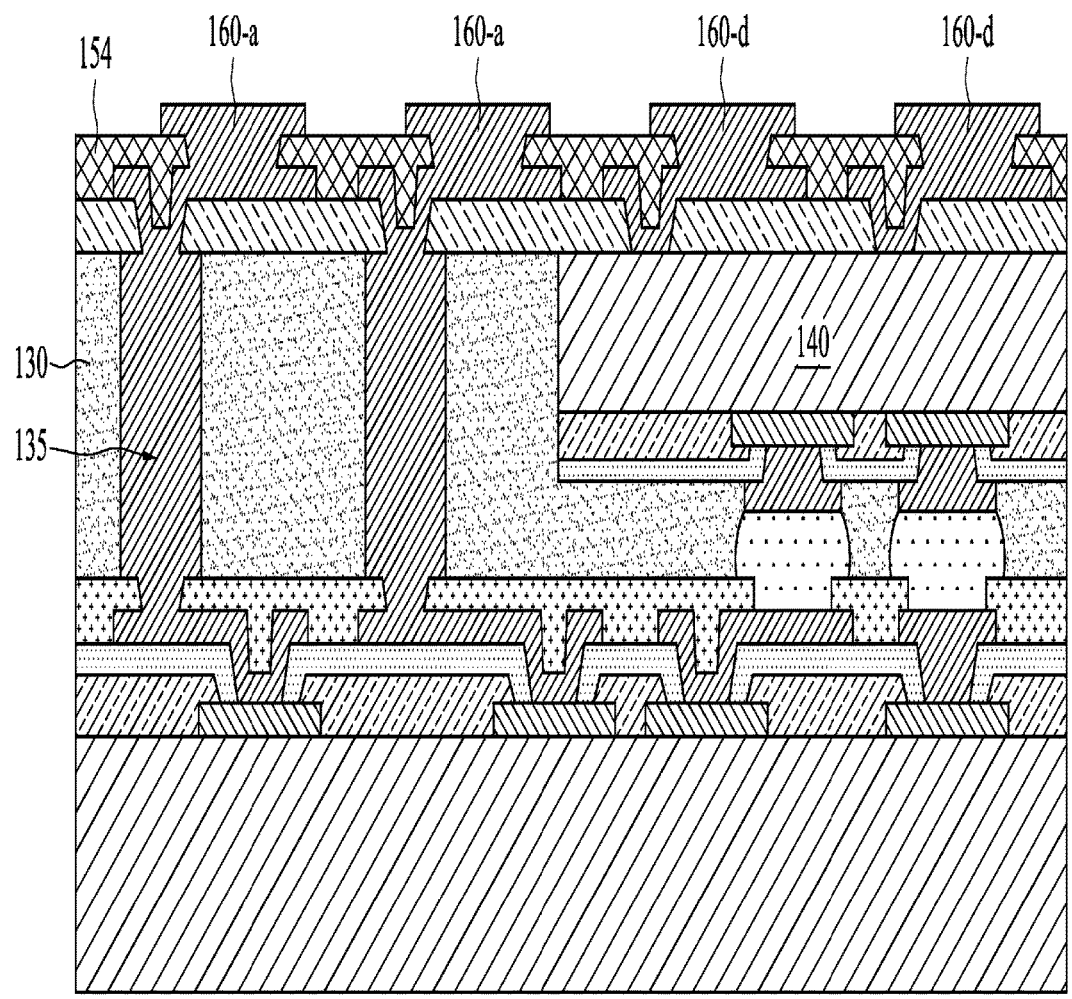
Figure 6K:
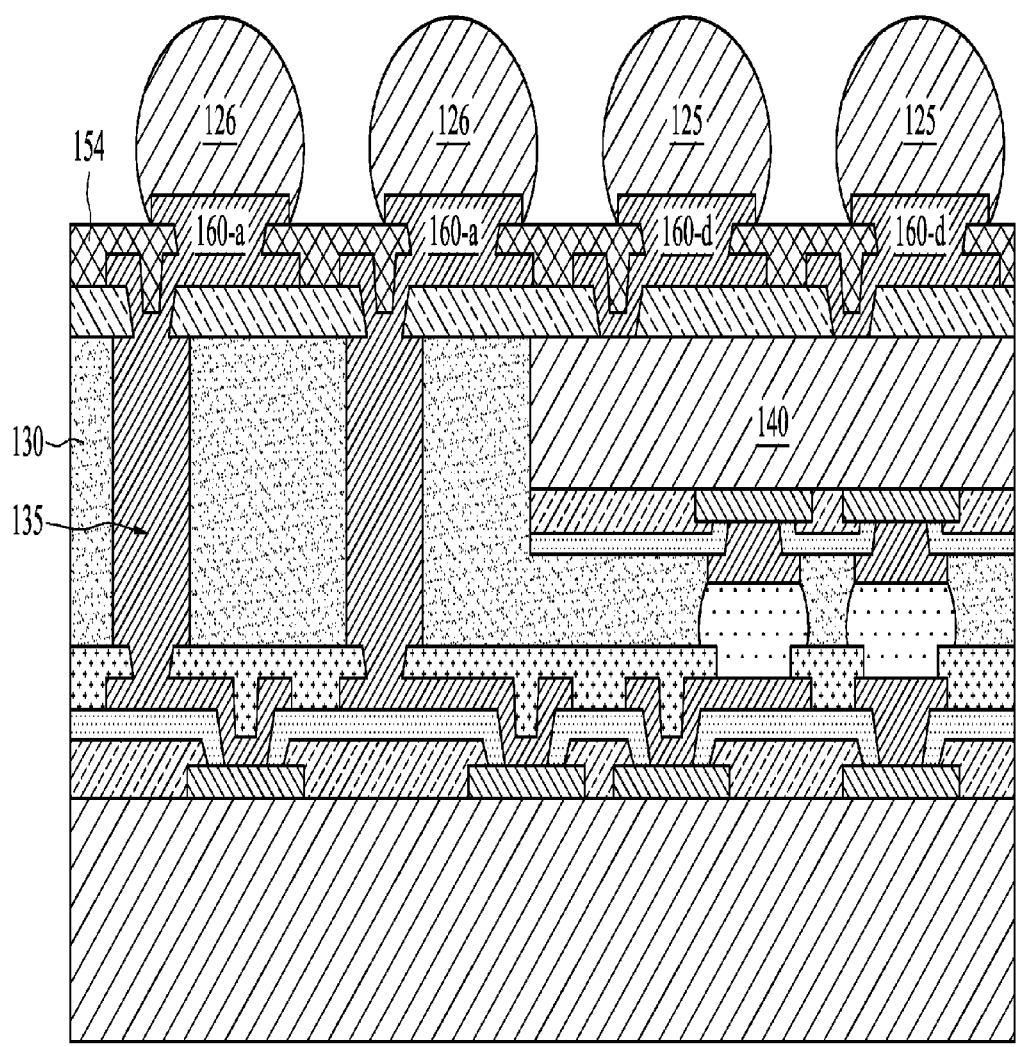

FIG. 6J is an operation of the present disclosure. A conductive material is filled into the openings 154a and covers the dielectric 154. A similar patterning operation as in FIG. 6H is adopted to remove a portion of the conductive material to form active metal structures 160-a and dummy metal structure 160-d as in FIG. 1.

In some embodiments, bumps are further disposed on the metal structures 160-a and 160-d. As in FIG. 6K, bumps like 125 and 126 are placed on the metal structures 160-a and 160-d. A dummy bump 125 is disposed on a corresponding dummy metal structure 160-d and an active bump 126 is disposed on a corresponding active metal structure 160-a. The bumps are disposed with various methods such as ball drop, stencil, pasting, or electroplating, etc. A reflow operation is also introduced to improve the wettability between the bumps and metal structures. A semiconductor structure 100 as in FIG. 1 is formed.

A semiconductor structure includes a substrate and a circuitry on the substrate. The semiconductor structure also includes a metal structure electrically coupled with the circuitry through a conductive plug. In some embodiments, the semiconductor structure includes a semiconductor die bonded with the substrate with a bump via a conductive pad on an active surface of the semiconductor die, and a passive surface of the semiconductor die contacting a dummy portion of the metal structure, wherein the passive surface is opposite to the active surface. Moreover, the semiconductor structure includes a molding compound filling a gap between the substrate and the active surface of the semiconductor die and surrounding the conductive plug.

In some embodiments, the semiconductor structure further includes a dummy bump connected to the dummy portion of the metal structure, wherein the dummy bump is configured to dissipate heat from the passive surface. The metal structure of the semiconductor structure includes a redistribution layer connecting to one end of the conductive plug.

In some embodiments, the metal structure of the semiconductor structure the metal structure includes an under bump metal (UBM) for receiving the dummy bump. In some embodiments, the semiconductor structure includes an active bump connected to an active portion of the metal structure. In some embodiments, the circuitry on the substrate includes a post passivation inductor (PPI) and the PPI is connected to one end of the conductive plug.

In some embodiments, the conductive pad on the active surface of the semiconductor die is an under bump metal (UBM), and the conductive pad is connected to an interconnection of the semiconductor die.

A semiconductor structure includes a three dimensional stack including a first semiconductor die and a second semiconductor die. The second semiconductor die is connected with the first semiconductor die with a bump between the first semiconductor die and the second semiconductor die. The semiconductor structure includes a molding compound between the first semiconductor die and the second semiconductor die. A first portion of a metal structure over a surface of the three dimensional stack and contacting a backside of the second semiconductor die and a second portion of the metal structure over the surface of the three dimensional stack and configured for electrically connecting the three dimensional stack with an external electronic device.

In some embodiments, the semiconductor structure includes a conductive plug between the metal structure and the first semiconductor die. In some embodiments, the semiconductor structure includes a dummy bump connected with the first portion of the metal structure, wherein the dummy bump is configured to connect with a dummy pattern external to the three dimensional stack.

In some embodiments, the semiconductor structure includes a plurality of bumps configured for electrically connected to a printed circuit board (PCB). In some embodiments, the semiconductor structure includes a PPI on the first semiconductor die and electrically coupled to the first semiconductor die.

A method of manufacturing a semiconductor structure includes several operations. One of the operations is providing a substrate. One of the operations is forming a circuitry on the substrate. One of the operations is flip bonding a semiconductor die with the circuitry with a bump. One of the operations is forming a conductive plug with a first end connected with the circuitry. One of the operations is exposing a passive surface of the semiconductor die and a second end of the conductive plug. One of the operations is forming a metal structure on the backside of the semiconductor die and the second end of the conductive plug.

In some embodiments, the method includes disposing a molding compound on the substrate to surround the semiconductor die and the conductive plug.

In some embodiments, the method includes performing a grinding operation to remove a portion of the molding compound to expose a passive surface of the semiconductor die and a second end of the conductive plug.

In some embodiments, the method includes disposing a dummy bump on a portion of the metal structure.

In some embodiments, the method includes forming a PPI in the circuitry.

In some embodiments, the method includes forming a patterned photo resist on the substrate for forming the conductive plug.

Moreover, the scope of the present application is not intended to be limited to the particular embodiments of the process, machine, manufacture, and composition of matter, means, methods and steps described in the specification. As those skilled in the art will readily appreciate form the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, and compositions of matter, means, methods or steps. In addition, each claim constitutes a separate embodiment, and the combination of various claims and embodiments are within the scope of the invention.

What is claimed is:

1. A method of manufacturing a semiconductor structure, the method comprising:
   bonding a semiconductor die to a substrate, the substrate having circuitry thereon;
   forming a conductive plug with a first end connected to the substrate;
   disposing a molding compound on the substrate;
   after disposing the molding compound on the substrate, exposing a contact area of a passive surface of the semiconductor die and a contact area of a second end of the conductive plug, wherein the passive surface, the second end, and a surface of the molding compound are at a first same level; and
   after exposing, forming a metal structure on the passive surface of the semiconductor die and the second end of the conductive plug, the metal structure comprising an active portion including a first recess with a first active portion contact area below the first recess and a dummy portion including a second recess with a first dummy portion contact area below the second recess, wherein the forming the metal structure comprises:
     depositing the active portion on the conductive plug with the first active portion contact area being in contact with the contact area of the second end of the conductive plug, the active portion being electrically coupled with the circuitry through the conductive plug; and
     depositing the dummy portion on the semiconductor die with the first dummy portion contact area being in contact with the contact area of the passive surface of the semiconductor die and not being electrically coupled with any circuitry.

2. The method of claim 1, wherein disposing the molding compound on the substrate comprises the molding compound surrounding the semiconductor die and the conductive plug.

3. The method of claim 2, further comprising performing a grinding operation to remove a portion of the molding compound to expose the passive surface of the semiconductor die and the second end of the conductive plug.

4. The method of claim 1, further comprising disposing a dummy bump on a portion of the metal structure.

5. The method of claim 1, wherein the substrate comprises a post-passivation interconnect (PPI).

6. The method of claim 1, wherein forming the conductive plug comprises forming a patterned photo resist on the substrate.

7. A method of forming a semiconductor device, the method comprising:
   forming a conductive pillar on a substrate;
   bonding a first integrated circuit to the substrate;
   forming a molding compound between the first integrated circuit and the conductive pillar;
   forming an insulating layer over the molding compound, a first side of the insulating layer facing towards the molding compound and a second side of the insulating layer facing away from the molding compound;
   etching the insulating layer to expose a contact area of a passive surface of the first integrated circuit;

forming a metal structure over the insulating layer, wherein the metal structure comprises a dummy portion and an active portion, including:
- depositing material of the active portion comprising a single, continuous material extending from the conductive pillar to an uppermost surface of the metal structure, the active portion being electrically coupled to the conductive pillar; and
- depositing material of the dummy portion on the second side of the insulating layer and in physical contact with the contact area of the passive surface of the first integrated circuit, wherein the dummy portion is not electrically coupled to the first integrated circuit or the substrate.

8. The method of claim 7, wherein the substrate comprises a second integrated circuit.

9. The method of claim 7, wherein forming the conductive pillar is performed before bonding the first integrated circuit to the substrate.

10. The method of claim 7, further comprising thinning the molding compound to expose the first integrated circuit.

11. The method of claim 7, wherein the dummy portion directly contacts the first integrated circuit.

12. The method of claim 7, further comprising forming an external connection to the dummy portion.

13. The method of claim 12, wherein the external connection comprises a solder connection.

14. The method of claim 7, wherein bonding the first integrated circuit to the substrate comprises flip-chip bonding.

15. A method of forming a semiconductor device, the method comprising:
- forming a first insulating layer over a molding compound and a first integrated circuit, a passive surface of the first integrated circuit and a conductive plug being exposed in the first insulating layer;
- forming a dummy conductive portion over the first insulating layer, the dummy conductive portion extending through a first opening in the first insulating layer, wherein the dummy conductive portion comprises a single, continuous material that extends through the first insulating layer, and wherein the dummy conductive portion is electrically isolated from active circuitry;
- forming an active conductive portion over the first insulating layer, the active conductive portion extending through a second opening in the first insulating layer, the active conductive portion being electrically coupled to the conductive plug;
- flowing a soldering material onto a contact area surface of a dummy metallization layer that is electrically coupled to the dummy conductive portion to form a first conductive external connector electrically coupled to the dummy conductive portion, the first conductive external connector covering the contact area surface and a separate sidewall surface portion of the dummy metallization layer; and
- forming a second conductive external connector electrically coupled to the active conductive portion.

16. The method of claim 15, wherein the dummy conductive portion directly contacts the first integrated circuit.

17. The method of claim 15, further comprising, prior to forming the first insulating layer, electrically coupling the first integrated circuit to a substrate.

18. The method of claim 17, wherein the substrate comprises a second integrated circuit.

19. The method of claim 15, wherein the first conductive external connector and the second conductive external connector comprise solder connections.

20. The method of claim 15, further comprising, prior to forming the first insulating layer:
- forming the molding compound over the first integrated circuit and the conductive plug; and
- thinning the molding compound to expose the first integrated circuit and the conductive plug.

* * * * *